United States Patent
Wittig et al.

[11] Patent Number: 6,108,681
[45] Date of Patent: Aug. 22, 2000

[54] SYSTEM FOR SHARING RESOURCES IN A DIGITAL FILTER

[75] Inventors: Karl Wittig, New York, N.Y.; Gene Turkenich, Hillsdale, N.J.

[73] Assignee: Philips Electronics North America Corporation, New York, N.Y.

[21] Appl. No.: 09/031,698

[22] Filed: Feb. 27, 1998

[51] Int. Cl.[7] .................................................. G06F 17/10
[52] U.S. Cl. .......................................... 708/319; 708/322
[58] Field of Search .................................... 708/319, 322

[56] References Cited

U.S. PATENT DOCUMENTS

| | | | |
|---|---|---|---|
| 3,633,105 | 1/1972 | Lender et al. | 708/319 |
| 4,862,402 | 8/1989 | Shah et al. | 364/724.12 |
| 5,297,069 | 3/1994 | Asato et al. | 708/319 |
| 5,479,363 | 12/1995 | Willson, Jr. et al. | 364/724.16 |
| 5,771,185 | 6/1998 | Miyake et al. | 708/319 |
| 5,777,912 | 7/1998 | Leung et al. | 708/319 |
| 5,831,879 | 11/1998 | Yom et al. | 708/319 |

FOREIGN PATENT DOCUMENTS

| 2161345 | 1/1996 | United Kingdom | H04B 3/23 |
|---|---|---|---|

*Primary Examiner*—David H. Malzahn
*Attorney, Agent, or Firm*—Edward W. Goodman

[57] ABSTRACT

A digital filter has a filter cell for generating processed data. The digital filter cell includes plurality of coefficient registers which are arranged to circulate a plurality of coefficient values that correspond to a plurality of coefficients such that each of the plurality of coefficients is output once during a predetermined period. One or more data registers are arranged to circulate a data value for a time which is at least as long as the predetermined period such that the data value is output each time that a different one of the plurality of coefficients is output. A circuit receives each output data value and each output coefficient and generates processed data by processing each output data value with each output coefficient.

19 Claims, 4 Drawing Sheets

|  | COEFFICIENT VALUES IN COEFFICIENT REGISTERS | | | | DATA VALUES IN DATA REGISTERS | | | |
|---|---|---|---|---|---|---|---|---|
| TIME | C1 (14a) | C2 (14b) | C3 (14c) | C4 (14d) | D1 (11a) | D2 (11b) | D3 (11c) | D4 (9) |
| T0 | 1 | 2 | 3 | 4 | 1 | 2 | 3 | 4 |
| T1 | 2 | 3 | 4 | 1 | 2 | 3 | 4 | 5 |
| T2 | 3 | 4 | 1 | 2 | 3 | 4 | 2 | 5 |
| T3 | ④ | 1 | 2 | 3 | ④ | 2 | 3 | 5 |
| T4 | 1 | 2 | 3 | 4 | 2 | 3 | 4 | 5 |
| T5 | 2 | 3 | 4 | 1 | 3 | 4 | 5 | 6 |
| T6 | ③ | 4 | 1 | 2 | ④ | 5 | 3 | 6 |
| T7 | 4 | 1 | 2 | 3 | 5 | 3 | 4 | 6 |
| T8 | 1 | 2 | 3 | 4 | 3 | 4 | 5 | 6 |
| T9 | ② | 3 | 4 | 1 | ④ | 5 | 6 | 7 |
| T10 | 3 | 4 | 1 | 2 | 5 | 6 | 4 | 7 |
| T11 | 4 | 1 | 2 | 3 | 6 | 4 | 5 | 7 |
| T12 | ① | 2 | 3 | 4 | ④ | 5 | 6 | 7 |
| T13 | 2 | 3 | 4 | 1 | 5 | 6 | 7 | 8 |
| ... | ... | | | | ... | | | |

FIG. 3

SYSTEM FOR SHARING RESOURCES IN A DIGITAL FILTER

BACKGROUND OF THE INVENTION

1. Field of the Invention

The present invention is directed to resource sharing in a digital filter. In particular, the invention is directed to a digital filter comprised of cells which process plural data values and filter coefficients using the same circuitry.

2. Description of the Related Art

Conventional digital filters, such as finite impulse response (hereinafter "FIR") filters, are comprised of a plurality of filter cells, or "tap" cells, arranged in series. Each filter cell includes a data register for storing a sampled data value and a coefficient register which stores a coefficient for that particular cell. In operation, the same sampled data value is input sequentially to each filter cell, and is multiplied by a coefficient for that cell. The results of these multiplications are then output and combined in order to generate the filter's output.

Different types of filter outputs require a different number of filter cells. For example, only two filter cells may be required to simulate the effects of a simple low-pass filter. Additional filter cells, however, may be required to perform more complex filtering. In this regard, generally speaking, as the complexity of the filter's function increases, the number of cells in the filter increases, thereby leading to an increase in the filter's size. This can be problematic, particularly in cases where a large number of filter cells are required, but where there is a limited amount of available space.

There are different ways to decrease a filter's size without decreasing its efficacy. For example, it is possible to remove multiplication circuits from the filter, as described, for example, in U.S. Pat. No. 4,862,402 (Shah et al.). One way to decrease a filter's size, without removing multiplication circuits, is known as resource sharing. Conventional resource sharing involves using the same multiplication circuit to multiply different data values by different coefficients. Since the multiplication circuit is typically the largest component of a digital filter, reducing the number of multiplication circuits in the filter by resource sharing reduces the size of the filter significantly without reducing its capabilities. Advantages flowing from this reduction in size, however, are tempered by the way in which conventional resource sharing reduces the number of multiplication circuits.

More specifically, in conventional resource sharing, two multiplexers are used to control which data values and which coefficients are transmitted to the multiplication circuit. These multiplexers introduce a propagation delay into the filter cell which reduces the maximum clock frequency at which the filter can operate. Moreover, the multiplexers take up additional space, thereby reducing the space savings achieved by the reduction in the number of multiplication circuits.

In addition to the foregoing deficiencies, conventional resource sharing does not adequately address problems specific to adaptive digital filters. In this regard, an adaptive digital filter includes adaptation circuitry in each tap cell, which is designed to update each tap cell's coefficients based on a variety of factors, such as channel characteristics, etc., that could affect data transmission. Although the adaptation circuitry enhances the filter's functionality, the adaptation circuitry also increases the size of the filter.

More specifically, algorithms for generating "adaptive" coefficients, such as the well-known least-mean-square (hereinafter "LMS") algorithm, require a number of multiplication and/or addition operations to be performed on the coefficients. Consequently, several multiplication and/or addition circuits are required on each tap cell in order to perform the additional calculations. For the reasons noted above, this additional circuitry increases the overall size of the filter significantly.

Thus, there exists a need for a way in which to reduce the amount of circuitry used in an adaptive digital filter, without adversely affecting the operation of the filter.

SUMMARY OF THE INVENTION

The present invention addresses the foregoing need by providing a way in which to share circuitry for coefficient adaptation and multiplication within a single filter cell of a digital filter. According to the invention, a plurality of coefficient registers in the filter cell circulate values corresponding to the coefficients, while one or more data registers in the filter cell circulate a data value such that the data value is output each time a different one of the coefficients is output. A circuit, such as a multiplication circuit, within the cell then processes output data values and coefficients.

By virtue of the foregoing arrangement, it is possible, within a single filter cell, to process a data value with a plurality of coefficients using the same processing circuit. Accordingly, less circuitry is used in the filter cell, thereby resulting in a decrease in the size of a filter including such a cell, without a corresponding decrease in the filter's capabilities.

Thus, according to one aspect, the present invention is a digital filter having a filter cell for generating processed data. The filter cell includes a plurality of coefficient registers which are arranged to circulate a plurality of coefficient values that correspond to a plurality of coefficients, such that each of the plurality of coefficients is output once during a predetermined period. One or more data registers are arranged to circulate a data value for a time which is at least as long as the predetermined period such that the data value is output each time that a different one of the plurality of coefficients is output. A circuit then receives each output data value and each output coefficient and generates processed data by processing each output data value with each output coefficient.

In preferred embodiments of the invention, the digital filter also includes a plurality of logic stages arranged among the plurality of coefficient registers. In these embodiments, the plurality of logic stages performs processing on the coefficient values so as to generate each of the plurality of coefficients which are output by the plurality of coefficient registers. By virtue of this feature of the invention, it is possible to update multiple coefficient values without significantly increasing the amount of circuitry in the filter cell as compared with a filter cell which updates a single coefficient only.

In other preferred embodiments, the invention includes an input data register, which is arranged in series with the one or more data registers, and which receives an additional data value from a source external to the filter cell. In these embodiments, during the predetermined period, the input register shifts the additional data value into the one or more data registers so that the one or more data registers circulate the additional data value. This feature of the invention facilitates input of data into the system so that the resources of the filter cell may be shared by additional data values.

In particularly preferred embodiments of the invention, there are a plurality of data registers which circulate a plurality of data values. In these embodiments of the invention, the plurality of data registers circulate a first set of data values for a time corresponding to the predetermined period and, following the predetermined period, the plurality of data registers circulate a second set of data values for a time corresponding to the predetermined period, where the second set of data values includes the additional data value from the input data register and has a same number of data values as the first set of data values. By virtue of this feature of the invention, it is possible to share circuitry for updating coefficients in a single filter cell, thereby providing for further reductions in filter size.

According to another aspect, the present invention is a method of generating processed data in a digital filter cell. The method includes circulating a plurality of coefficient values among a plurality of coefficient registers in the digital filter cell, and outputting each of a plurality of coefficients from the plurality of coefficient registers once during a predetermined period, the plurality of coefficients being based on the plurality of coefficient values. A data value is then circulated among one or more data registers for a time which is at least as long as the predetermined period. In the invention, the data value is output from the one or more data registers each time that a different one of the plurality of coefficients is output. Each output data value and each output coefficient are then processed so as to generate a processed data value.

The foregoing method reduces the amount of circuitry required in a filter cell by including, in a single filter cell, both circuitry for adapting filter coefficients and circuitry used to process those coefficients. Thus, by virtue of the foregoing method, it is possible to reduce the number of filter cells required in the filter, thereby also reducing the overall size of the filter.

According to another aspect, the present invention is a digital filter having a plurality of filter cells, each of the filter cells for processing a plurality of data values together with a plurality of coefficient values in order to generate a filter cell output. The digital filter also includes an adder circuit which adds the filter cell output from each of the plurality of filter cells in order to generate a filter output. Each of the plurality of filter cells includes a plurality of coefficient registers which are arranged to circulate a plurality of coefficient values that correspond to the plurality of coefficients such that each of the plurality of coefficients is output once during a predetermined period. Each filter cell also includes one or more data registers which are arranged to circulate a data value for a time which is at least as long as the predetermined period such that the data value is output each time that a different one of the plurality of coefficients is output. A multiplier in each filter cell receives each output data value and each output coefficient and generates an output product, and a storage register in each filter cell stores the output product of each output data value and each output coefficient. An adder circuit in each filter cell adds the product values stored in the storage register in order to generate a filter cell output for the filter cell.

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

FIG. 3 is a timing table showing circulation of data values and coefficient values in the filter cell of FIG. 2.

DETAILED DESCRIPTION OF THE PREFERRED EMBODIMENTS

First Embodiment

Figure 1:
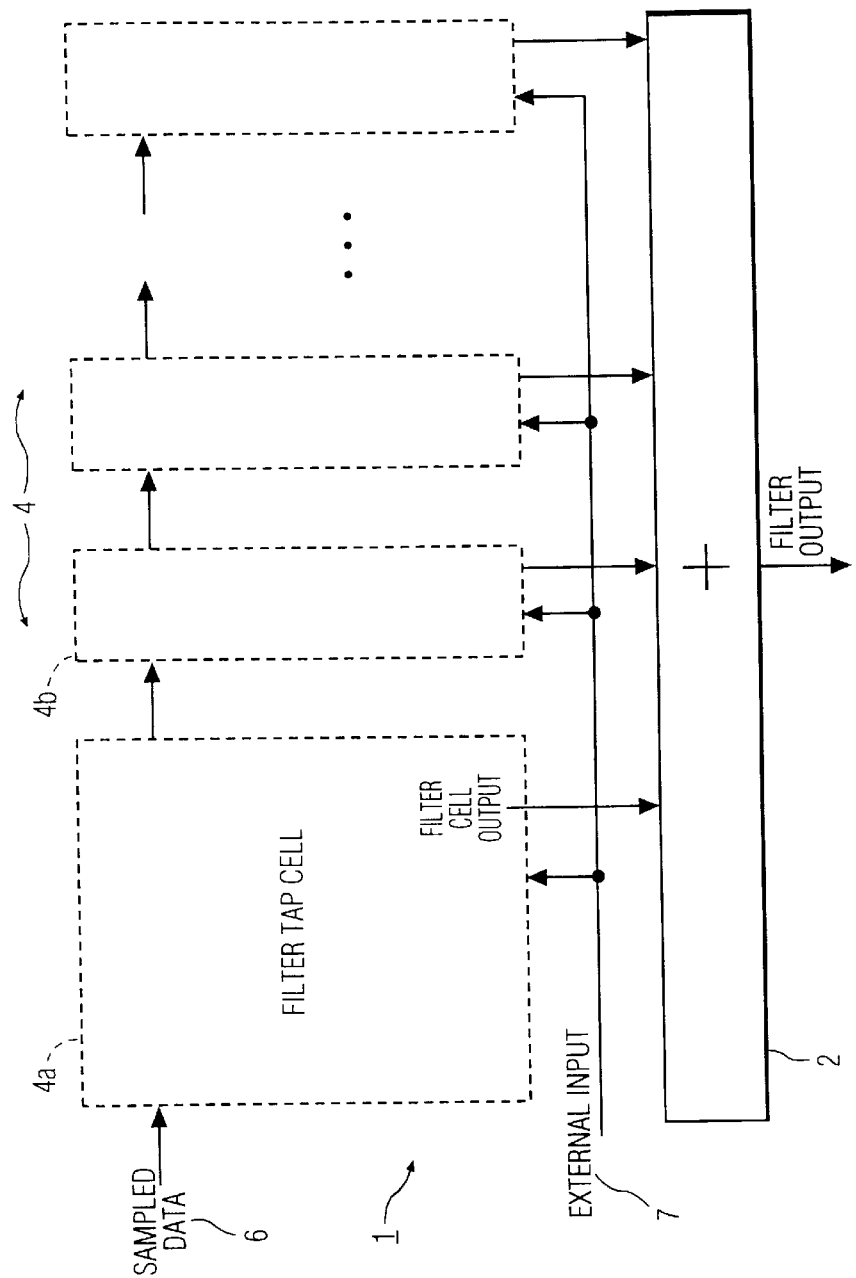
FIG. 1 is a block diagram showing an adaptive FIR filter in accordance with the present invention.

Initially, it is noted that although the present invention can be used with any type of digital filter, the invention will be described in the context of an adaptive FIR filter. In this regard, FIG. 1 shows an adaptive FIR filter having filter cells which implement resource sharing in accordance with the present invention. As shown in FIG. 1, digital filter 1 includes adder circuit 2 and a plurality of filter cells 4. Any number of these filter cells may be included in digital filter 1, depending upon the desired functionality of the filter.

Digital filter 1 operates by sampling data from a signal at a predetermined sampling rate, and sequentially shifting the sampled data, labeled 6 in FIG. 1, into each of filter cells 4 in accordance with a sampling clock signal. For example, sampled data 6 is shifted into filter cell 4a in response to a first sampling clock pulse. Next, when additional data is sampled at a next sampling clock pulse, that additional data is shifted into filter cell 4a, and the data already in filter cell 4a (i.e., sampled data 6) is shifted into filter cell 4b, and so on.

Each of filter cells 4 processes the sampled data within a single period of the sampling clock signal. This processing may take into account external input 7, which is shown in FIG. 1 and of which examples are described in detail below. After sampled data has been processed by a filter cell, resulting processed data is output to adder circuit 2. Adder circuit 2 combines the output data from each of filter cells 4 in order to generate the output of filter 1.

Figure 2:
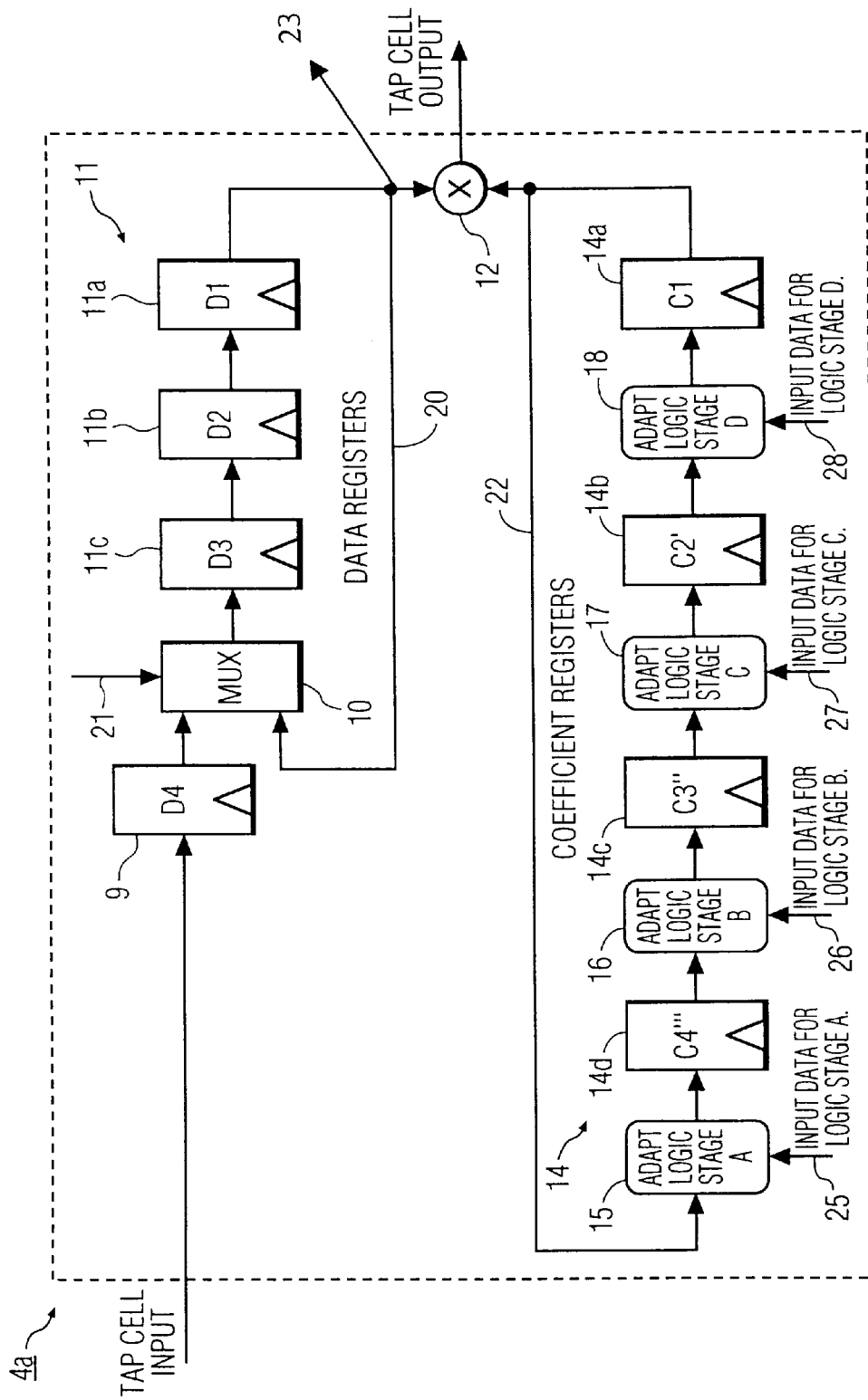
FIG. 2 is a block diagram of a first embodiment of a filter cell use in the FIR filter of FIG. 1.

FIG. 2 shows the internal circuitry of filter cell 4a shown in FIG. 1. Since filter cells 4 are identical in structure, for the sake of brevity, only filter cell 4a will be described herein. As shown in FIG. 2, filter cell 4a includes input register 9, multiplexer 10, data registers 11, processing circuit 12, which is preferably a multiplier circuit, coefficient registers 14, and logic stages 15, 16, 17 and 18. The arrangement shown in FIG. 2 enables data values shifted into filter cell 4a to share both processing circuit 12 and coefficients output by coefficient registers 14, as is clear from the following description.

As shown in FIG. 2, input register 9 is arranged in series with multiplexer 10 and data registers 11. Both input register 9 and data registers 11 can comprise conventional shift registers, which shift data in response to a clock signal. In this regard, as described in more detail below, input register 9 shifts data in response to the sampling clock signal noted above. In contrast, data registers 11 shift data in response to a circulation clock signal, which has a frequency that is a multiple of the frequency of the sampling clock signal. This arrangement provides for multiple shifting of each of data registers 11 for every single shift of input register 9.

Data register 11a outputs a data value to processing circuit 12 at each circulation clock pulse. As shown in FIG. 2, that same data value is fed back to multiplexer 10 via feedback path 20, and is applied to an output 23 for application to a following cell, for example, cell 4b. Multiplexer 10 also receives selection signal 21 and an output from input register 9. Selection signal 21 causes multiplexer 10 to shift data from register 9 during sampling clock pulses, and causes multiplexer 10 to shift data from feedback path 20 during circulation clock pulses. By virtue of this arrangement, during circulation clock pulses, data values circulate within data registers 11. However, at each sampling clock pulse, an additional data value from input register 9 is shifted into data registers 11, where the additional data value is circulated. Thus, to summarize, data registers 11 circulate a first set of data values for a predetermined time, and, following the predetermined time, data registers 11 circulate a second set of data values (which includes the additional data value) for the predetermined time, and so on.

In this regard, data registers 11 are designed to circulate the same number of data values. Accordingly, each time an additional data value is input into data registers 11, one of the data values already within data registers 11 is removed. Specifically, the data value in feedback path 20 (i.e., the data value which was last output to processing circuit 12) is removed, since that data value is not input back into data registers 11. Since only one data value is removed per sampling clock period, data registers 11 generally circulate a data value for a plurality of sampling clock periods before that data value is removed. The exception to this general rule is the case in which a single data value is circulated in a single data register. In this case, the data value only needs to be circulated for one sampling clock period for reasons which will become clear below. An example of a filter cell having only one data register is provided in the second embodiment below.

Coefficient registers 14 are arranged to circulate a plurality of coefficient values that correspond to a plurality of coefficients, so that each of the plurality of coefficient values is output once during a predetermined period. More specifically, coefficient values are shifted among coefficient registers 14 such that, at a predetermined period, which preferably corresponds to a period of the circulation clock signal, coefficient register 14a outputs a coefficient to processing circuit 12. Thus, at each period of the circulation clock signal, processing circuit 12 receives a data value from data register 11a and a coefficient from coefficient register 14a. At this time, processing circuit 12 processes (e.g., multiplies) these two values to generate an output for the filter cell. In this regard, it is noted that although a multiplier circuit is described herein, processing circuit 12 can comprise any type of circuit depending, of course, upon the type of filter cell in which the invention is implemented and the type of coefficients being shared.

Regarding coefficient registers 14, as shown in FIG. 2, coefficient registers 14 circulate coefficient values by feeding a coefficient output to processing circuit 12 back along feedback path 22. This arrangement permits the same coefficients to circulate among coefficient registers 14, thereby making it possible for those coefficients to be shared by data values in data registers 11. That is, as described above, data registers 11 circulate a data value for a plurality of sampling clock periods before that data value is removed. As a result, the same data value is output several times to processing circuit 12 over several sampling clock signal periods. Each time that the same data value is output to processing circuit 12, a different coefficient value is output thereto from coefficient register 14a. As a result, each data value is processed with each coefficient. This process is illustrated below with respect to FIGS. 2 and 3.

In the preferred embodiment of the invention shown in FIG. 2, a plurality of logic stages 15, 16, 17 and 18 are arranged among coefficient registers 14. These logic stages receive external inputs 25, 26, 27 and 28, respectively, and, if necessary, calculate updated coefficients values corresponding to coefficients output by coefficient registers 14. More specifically, as noted above, filter cell 4a is an adaptive filter cell, meaning that coefficients therein may be updated periodically to correct unwanted changes in the data values caused, e.g., by changes in the transmission channel or the like. In the present invention, these updates are made via logic stages 15 to 18, where external inputs 25 to 28 can comprise filter error (i.e., a difference between expected and actual filter outputs) or the like.

Thus, in the present invention, coefficient computation is "broken up" into separate pipe-line stages, each of which is performed between appropriate coefficient registers. Accordingly, in these embodiments of the invention, coefficient values in coefficient registers 14b, 14c and 14d do not necessarily comprise actual coefficients, hence the "prime" indications on C2, C3 and C4. Rather, the coefficient values in these coefficient registers may represent intermediate values of the computation of the actual coefficients. This feature of the invention is advantageous, since it allows coefficient circulating and updating to be performed simultaneously, thereby further reducing the amount of hardware required to implement filter cell 4a.

In preferred embodiments of the invention, logic stages 15 to 18 update the coefficients using the well-known LMS algorithm. However, it is noted that the invention is not limited to updating the coefficients using this algorithm, and that any such algorithm may be used.

FIG. 3 shows a timing table which is used to explain the operation of digital filter cell 4a from times T0 to T13 for data values of 1 to 8 and coefficient values of 1 to 4. More specifically, as shown in FIG. 3, at time T0, coefficients values of 1, 2, 3 and 4 are in coefficient registers 14a, 14b, 14c and 14d, respectively, while data values of 1, 2 and 3 are in data registers 11a, 11b and 11c, respectively, and a data value of 4 is in input register 9. The following traces the path of data value 4 through filter cell 4a in order to illustrate sharing of both processing circuit 12 and coefficient values 1, 2, 3 and 4. It is to be understood, however, that the following description relating to data value 4 applies equally to all data values (e.g., data values 1, 2, 3, 5, 6...) input into filter cell 4a.

To begin, at time T1, in response to a signal indicating that a sampling clock pulse has occurred, data value 4 is shifted into data register 11c and data value 5 is shifted from an external source (not shown) into input register 9. This leaves data values 2, 3 and 4 to circulate in data registers 11. Circulation times for these values are indicated by bracket 30 in FIG. 3. That is, as shown in FIG. 3, at time T1 data value 4 is in data register 11c, at time T2 data value 4 is in data register 11b, and at time T3 data value 4 is in data register 11a. From data register 11a, data value 4 is output to processing circuit 12 and fed back to multiplexer 10. As noted above, circulation clock pulses (as opposed to sampling clock pulses) control shifting of data value 4 among data registers 11a, 11b and 11c.

At the same time that the foregoing circulation of data value 4 is taking place in data registers 11, coefficient values of 1 to 4 are being circulated in coefficient registers 14 in accordance with the circulation clock signal. That is, as shown in FIG. 3, at time T1 coefficient value 2 is at coefficient register 14a, at time T2 coefficient value 3 is at coefficient register 14a, and at time T3 coefficient value 4 is at coefficient register 14a. Thus, at time T3 (i.e., at the same time that data value 4 is output from data register 11a), coefficient value 4 is output to processing circuit 12, where coefficient value 4 is processed with data value 4.

Following time T3, at time T4 data value 4 is circulated back to data register 11c (since selection signal 21 has not yet indicated receipt of a sampling clock pulse) and coefficient value 1 is output from coefficient register 14a. Thus, after time T4, all four coefficient values (i.e., 1, 2, 3 and 4) have been output once during the time that data value 4 has been circulating in data registers 11. Accordingly, at time T5 (i.e., at the input of a sampling clock pulse) the coefficient values begin a new circulation cycle, circulating in a 2-3-4-1 sequence shown in brackets 31 in FIG. 3.

Also at time T5, selection signal 21 indicates to multiplexer 10 that a sampling clock pulse has been received. Thus, at time T5, data value 5 is shifted into data register 11c from input register 9, while, at the same time, data value 2 is removed from data registers 11. That is, at this point, data value 2 is input to multiplexer 10, which selects data value 5 and not data value 2 for shifting into data register 11c. This leaves data values 3, 4 and 5 circulating in data registers 11, and data value 6, which was input at the sampling clock pulse, in input register 9. The circulation times for data values 3, 4 and 5 are shown by bracket 32 in FIG. 3. Circulation of data values 3, 4 and 5 continue in the manner described above concurrently with circulation of coefficient values 1, 2, 3 and 4 in coefficient registers 14. As a result of these circulations, at time T6, data value 4 is output to processing circuit 12 and coefficient value 3 is also output to processing circuit 12.

Thereafter, circulation of data values 3, 4 and 5 continues until data value 6 is shifted into data register 11c at time T9. In this regard, data value 6 is shifted into data register 11c in response to an indication that a sampling clock pulse has been received. The sampling clock pulse also causes data value 7 to be input into input register 9, as shown. Also, at time T9 data value 4 is output to processing circuit 12 together with coefficient value 2 from coefficient register 14a. Thereafter, circulation of data values 4, 5 and 6 in data registers 11 continues (see bracket 34 in FIG. 3), while coefficients continue to circulate concurrently in coefficient registers 14. As shown in FIG. 3, during this same circulation cycle, at time T12 both data value 4 and coefficient value 1 are output to processing circuit 12 via data register 11a and coefficient register 14a, respectively. Thereafter, at time T13, data value 4 is removed from data registers 11 in the manner noted above.

Thus, as is clear from the foregoing example, filter cell 4a processes data value 4 with each of coefficients 1, 2, 3 and 4. This is highlighted by the circled values of FIG. 3. In addition, filter cell 4a does this using the same processing circuit. Accordingly, the invention accomplishes sharing of both coefficient values and processing circuit 12 within a single filter cell.

Second Embodiment

At this point, it is noted that the invention is not limited to using four data values and four coefficients in the manner set forth above. Rather, any number of coefficients and data values may be used in a filter cell so long as data registers in the filter cell circulate a data value for a time which is at least as long as the period during which the coefficients are circulated so that the data value is output each time that a different coefficient is output. Moreover, it is also noted that the invention need not be implemented using logic stages interspersed among coefficient registers.

Figure 4:
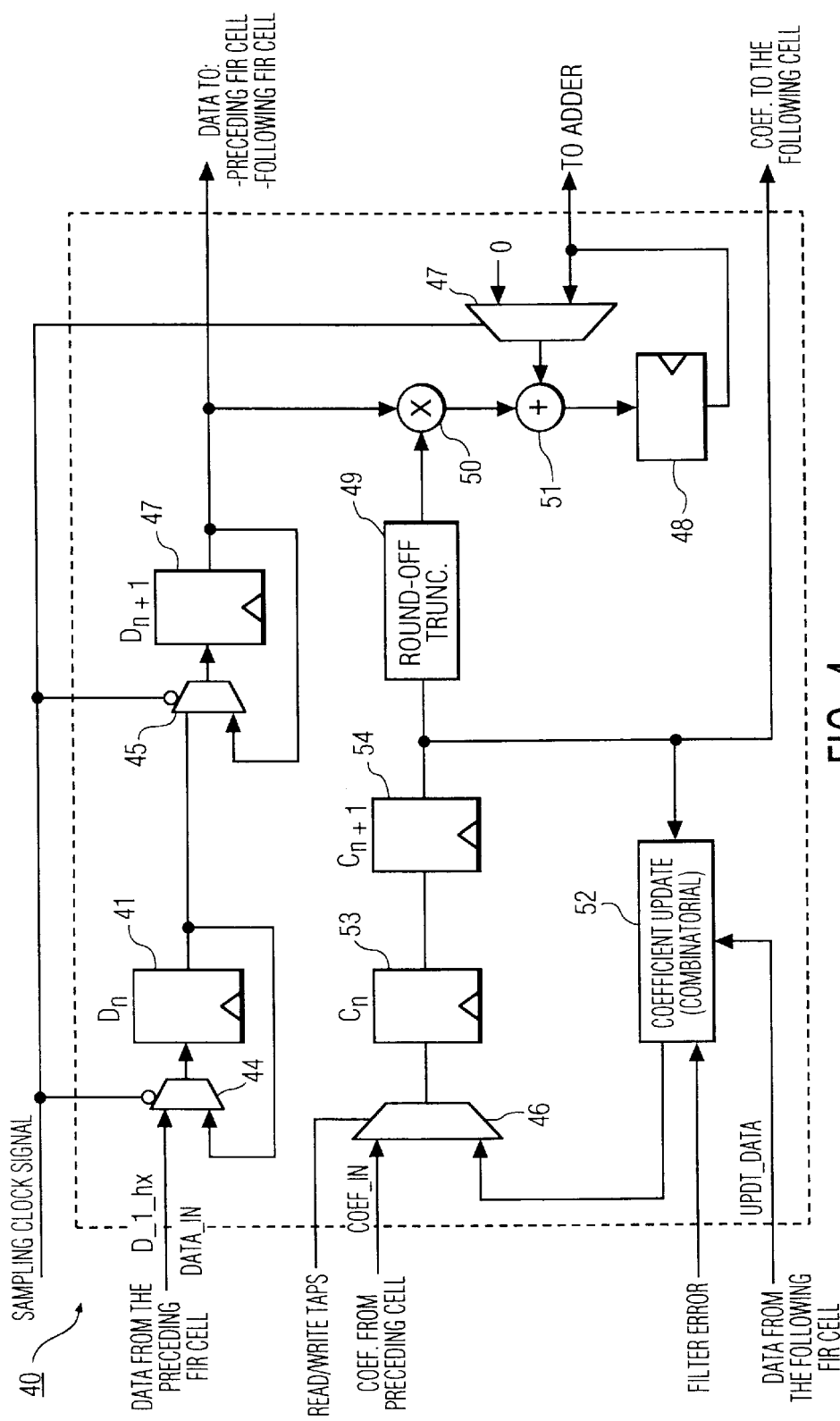
FIG. 4 is a block diagram of a second embodiment of a filter cell used in the FIR filter of FIG. 1.

In this regard, FIG. 4 shows an example of a two coefficient, one data register filter, in which different logic stages are not interspersed among coefficient registers. The embodiment of the invention shown in FIG. 4, namely filter cell 40, includes input register 41, data register 42, multiplexers 44, 45, 46 and 47, storage register 48, round-off/truncation circuit 49, multiplier circuit 50, adder circuit 51, coefficient update circuit 52, and coefficient registers 53 and 54. In this embodiment of the invention, operation of filter cell 40 is essentially the same as filter cell 4a shown in FIG. 2. Accordingly, focus here will be on operational aspects of filter cell 40 which differ from those of filter cell 4a above.

In this regard, the operation of input register 41, multiplexer 45, and coefficient registers 53 and 54 is substantially the same as operations of corresponding features described above. Accordingly, a detailed description thereof is omitted here for the sake of brevity. It is, however, worth noting that, in filter cell 40, a single data value (as opposed to plural data values) circulates within data register 42 during the sampling clock signal period. In addition, it is also noted that multiplexer 44 is provided in series with input register 41 so as to select a data value for input to register 41. A similarly-positioned multiplexer may also be added to filter cell 4a shown above.

Filter cell 40 includes storage register 48, which was not included in filter cell 4a above. Storage register 48 stores the product of a data value and each coefficient. At predetermined time periods, e.g., at each sampling clock pulse, multiplexer 47 provides these values to adder circuit 51, which adds these values together and outputs the sum of these products from filter cell 40. Round-off/truncation circuit 49 is also provided to round-off/truncate updated coefficient values prior to their multiplication with a data value. Coefficient update circuit 52 is used to update coefficient values based, for example, on external information such as filter error (i.e., the difference between expected and actual filter outputs), data from previous or following filter cells, etc. Multiplexer 46, which is controlled by read/write taps signal 56, also provides filter cell 40 with the ability to read coefficients from, and write coefficients to, a filter cell.

In operation, filter cell 40 circulates coefficients in coefficient registers 53 and 54, and circulates a data value in data register 42. This circulation is identical to that described above, except that coefficient update circuit 52 updates values of the coefficients, rather than interspersed logic stages. Likewise, shifting of additional data to and from input register 41 is identical to that described above. Accordingly, for the sake of brevity, a detailed description of these processes is omitted here.

The present invention has been described with respect to particular illustrative embodiments. It is to be understood that the invention is not limited to the above-described embodiments and modifications thereto, and that various changes and modifications may be made by those of ordinary skill in the art without departing from the spirit and scope of the appended claims.

What is claimed is:

1. A digital filter having a plurality of filter cells for generating processed data, each of the filter cells comprising:

a plurality of coefficient registers for circulating a plurality of coefficient values corresponding to a plurality of coefficients, said plurality of coefficient registers outputting each of the plurality of coefficients once during a predetermined time period;

one or more data registers for circulating a data value for a time period which is at least as long as the predetermined time period such that said one or more data registers outputs the data value each time that said plurality of coefficient registers outputs a different one of the plurality of coefficients is output;

an output for supplying said output data value to a following filter cell in said plurality of filter cells; and a circuit for receiving each output data value and each output coefficient and for generating processed data by processing each output data value with each output coefficient.

2. The digital filter as claimed in claim 1, wherein each of said plurality of filter cells further comprises a plurality of logic stages arranged among the plurality of coefficient registers, the plurality of logic stages processing the coefficient values so as to generate each of the plurality of coefficients which are output by the plurality of coefficient registers.

3. The digital filter as claimed in claim 2, wherein the plurality of logic stages update the coefficient values in accordance with a change in a data value.

4. The digital filter as claimed in claim 2, wherein the plurality of logic stages perform a least-mean-squares algorithm on the coefficient values in order to update each of the plurality of coefficients.

5. The digital filter as claimed in claim 1, wherein each of the plurality of filter cells further comprises an input data register arranged in series with the one or more data registers for receiving an additional data value from a source external to the filter cell, said input data register shifting the additional data value into the one or more data registers during the predetermined time period so that the one or more data registers circulate the additional data value.

6. The digital filter as claimed in claim 5, wherein, in each of said plurality of filter cells, the one or more data registers comprises a plurality of data registers for circulating a plurality of data values, said plurality of data registers (i) circulating a first set of data values for a time period corresponding to the predetermined time period, and, following the predetermined time period, (ii) circulating a second set of data values for a time period corresponding to the predetermined time period, the second set of data values including the additional data value from the input data register and having a same number of data values as the first set of data values.

7. The digital filter as claimed in claim 5, wherein each of said plurality of filter cells further comprises a multiplexer disposed between the input data register and the one or more data registers, the multiplexer receiving a signal corresponding to the predetermined time period for shifting the additional data value into the one or more data registers.

8. The digital filter as claimed in claim 5, wherein the predetermined time period corresponds to one sampling period of the digital filter.

9. The digital filter as claimed in claim 1, wherein the circuit comprises a multiplier circuit for multiplying each output data value by each output coefficient in order to generate an output product corresponding to the processed data.

10. A method of generating processed data in a digital filter comprising a plurality of filter cells, the method comprising the steps:

circulating a plurality of coefficient values among a plurality of coefficient registers in each of the plurality of filter cells;

outputting each of a plurality of coefficients from the plurality of coefficient registers once during a predetermined time period, the plurality of coefficients being based on the plurality of coefficient values;

circulating a data value among one or more data registers in each of the plurality of filter cells for a time period which is at least as long as the predetermined time period, the data value being output from the one or more data registers each time that a different one of the plurality of coefficients is output;

processing each output data value and each output coefficient so as to generate a processed data value; and applying said output data value as an input data value to a following filter cell in said plurality of filter cells.

11. The method as claimed in claim 10, further comprising, before the outputting step, the step: processing each of the plurality of coefficient values so as to generate each of the plurality of coefficients.

12. The method as claimed in claim 11, wherein the processing step comprises updating the coefficient values in accordance with a change in a data value.

13. The method as claimed in claim 11, wherein the processing step comprises performing a least-mean-squares algorithm on the coefficient values in order to update each of the plurality of coefficients.

14. The method as claimed in claim 10, further comprising the steps:

receiving, in an input register, an additional data value from a source external to the filter cell; and shifting the additional data value into the one or more data registers during the predetermined time period so that the one or more data registers circulate the additional data value.

15. The method as claimed in claim 14, wherein the circulating step circulates a plurality of data values among a plurality of data registers, said circulating step (i) circulating a first set of data values in the plurality of data registers for a time period corresponding to the predetermined time period, and, following the predetermined period, (ii) circulating a second set of data values in the plurality of data registers for a time period corresponding to the predetermined time period, the second set of data values including the additional data value from the input data register and having a same number of data values as the first set of data values.

16. The method as claimed in claim 14, wherein the method further comprises the step:

shifting the additional data value into the one or more data registers based on a clock signal corresponding to the predetermined time period.

17. The method as claimed in claim 14, wherein the predetermined time period corresponds to one sampling period of the digital filter.

18. The method as claimed in claim 10, wherein the processing step comprises multiplying each output data value by each output coefficient in order to generate an output product corresponding to the processed data.

19. A digital filter comprising:

a plurality of filter cells, each of the filter cells processing a plurality of data values together with a plurality of coefficient values in order to generate a filter cell output; and an adder circuit for adding the filter cell outputs from the plurality of filter cells in order to generate a filter output; wherein each of the plurality of filter cells comprises:

a plurality of coefficient registers for circulating a plurality of coefficient values corresponding to the plurality of coefficients, said plurality of coefficient registers outputting each of the plurality of coefficients once during a predetermined time period;

one or more data registers for circulating a data value for a time which is at least as long as the predetermined time period, said one or more data registers outputting the data value each time that a different one of the plurality of coefficients is output;

a data output for supplying the outputted data value to a following filter cell;

a multiplier circuit for multiplying each output data value and each output coefficient to generate an output product;

an adder circuit having a first input coupled to an output of said multiplier circuit; and a storage register having an input coupled to an output of said adder circuit and an output coupled to a second input of said adder circuit, said storage register and said adder circuit forming and accumulator for the output products of multiplier circuit, the output of the storage register forming a filter cell output for the filter cell.

* * * * *